(12) United States Patent
Chiang et al.

(10) Patent No.: US 9,287,888 B2
(45) Date of Patent: Mar. 15, 2016

(54) CONVERTER WITH AN ADDITIONAL DC OFFSET AND METHOD THEREOF

(71) Applicant: Realtek Semiconductor Corp., Hsinchu (TW)

(72) Inventors: Ming-Cheng Chiang, Hsin Chu (TW); Wei-Cheng Tang, Chu Pei (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/588,816

(22) Filed: Jan. 2, 2015

(65) Prior Publication Data

US 2015/0194976 A1 Jul. 9, 2015

(30) Foreign Application Priority Data

Jan. 3, 2014 (TW) .............................. 103100251 A

(51) Int. Cl.
*H03M 1/06* (2006.01)
*H03M 1/08* (2006.01)
*H03M 1/18* (2006.01)
*H03M 1/70* (2006.01)

(52) U.S. Cl.
CPC ............ *H03M 1/0845* (2013.01); *H03M 1/183* (2013.01); *H03M 1/70* (2013.01)

(58) Field of Classification Search
CPC ..... H03M 1/0845; H03M 1/183; H03M 1/70; H03M 1/68; H03M 1/765; H03M 1/804; H03M 3/43; H03M 3/456; H03M 3/464; H03M 1/442; H03M 1/1023; H03M 1/46; H03M 3/452; H03M 1/0607; H03M 1/12; H03M 1/403; H03M 3/458; H03M 1/00; H03M 1/66; H03M 1/802; H03M 2201/934; H03M 3/356; H03M 7/304; H03G 3/348
USPC .................................. 341/144, 155, 172, 118
See application file for complete search history.

(56) References Cited

U.S. PATENT DOCUMENTS

| 5,574,457 | A | * | 11/1996 | Garrity et al. .................. 341/172 |
| 5,764,176 | A | * | 6/1998 | Ginetti .......................... 341/161 |
| 7,009,549 | B1 | * | 3/2006 | Corsi ............................. 341/161 |
| 2003/0099233 | A1 | * | 5/2003 | Bae et al. ....................... 370/389 |
| 2007/0063885 | A1 | * | 3/2007 | Hong ............................. 341/172 |
| 2008/0129575 | A1 | * | 6/2008 | Huang ........................... 341/172 |
| 2011/0260895 | A1 | * | 10/2011 | Lou et al. ...................... 341/102 |

OTHER PUBLICATIONS

Mohsen et al., "13-bit 205 MS/s Time-Interleaved Pipelined ADC with Digital Background Calibration", Circuits and Systems (ISCAS), Proceedings of 2010 IEEE International Symposium on, May 30, 2010-Jun. 2, 2010, pp. 1727-1730.

* cited by examiner

*Primary Examiner* — Jean B Jeanglaude
(74) *Attorney, Agent, or Firm* — Muncy, Geissler, Olds & Lowe, P.C.

(57) ABSTRACT

A converter with an additional DC offset includes a switch circuit, a first capacitor, a plurality of additional capacitor cells and an operational amplifier. The converter uses a first additional capacitor cell and a second additional capacitor cell having a capacitor difference with the first additional capacitor to store two charges having different polarity and magnitude with each other, and further generate an inverted DC offset according to a difference between the two charges to compensate a DC offset.

12 Claims, 16 Drawing Sheets

| input code | 000 | 001 | 010 | 011 | 100 | 101 | 110 | 111 |
|---|---|---|---|---|---|---|---|---|
| capacitor cell 7 | ☐ | ☐ | ☐ | ☐ | ☐ | ☐ | ☐ | ▨ |
| capacitor cell 6 | ☐ | ☐ | ☐ | ☐ | ☐ | ☐ | ▨ | ▨ |
| capacitor cell 5 | ☐ | ☐ | ☐ | ☐ | ☐ | ▨ | ▨ | ▨ |
| capacitor cell 4 | ☐ | ☐ | ☐ | ☐ | ▨ | ▨ | ▨ | ▨ |
| capacitor cell 3 | ☐ | ☐ | ☐ | ▨ | ▨ | ▨ | ▨ | ▨ |
| capacitor cell 2 | ☐ | ☐ | ▨ | ▨ | ▨ | ▨ | ▨ | ▨ |
| capacitor cell 1 | ☐ | ▨ | ▨ | ▨ | ▨ | ▨ | ▨ | ▨ |

Fig. 2A (Prior Art)

| input code | 000 | 001 | 010 | 011 | 100 | 101 | 110 | 111 |
|---|---|---|---|---|---|---|---|---|
| capacitor cell 7 | ☐ | ☐ | ☐ | ☐ | ☐ | ☐ | ☐ | ▨ |
| capacitor cell 6 | ☐ | ☐ | ☐ | ☐ | ☐ | ☐ | ▨ | ▨ |
| capacitor cell 5 | ☐ | ☐ | ☐ | ☐ | ☐ | ▨ | ▨ | ▨ |
| capacitor cell 4 | ☐ | ☐ | ☐ | ☐ | ▨ | ▨ | ▨ | ▨ |
| capacitor cell 3 | ☐ | ☐ | ☐ | ▨ | ▨ | ▨ | ▨ | ▨ |
| capacitor cell 2 | ☐ | ☐ | ▨ | ▨ | ▨ | ▨ | ▨ | ▨ |
| capacitor cell 1 | ☐ | ▨ | ▨ | ▨ | ▨ | ▨ | ▨ | ▨ |
| capacitor cell 0 | ☐ | ☐ | ☐ | ☐ | ☐ | ☐ | ☐ | ■ |

Fig. 2B (Prior Art)

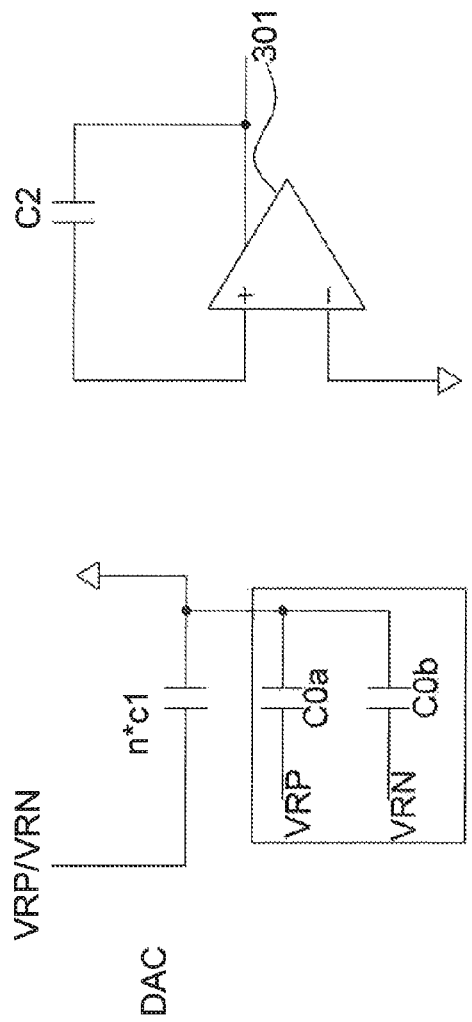
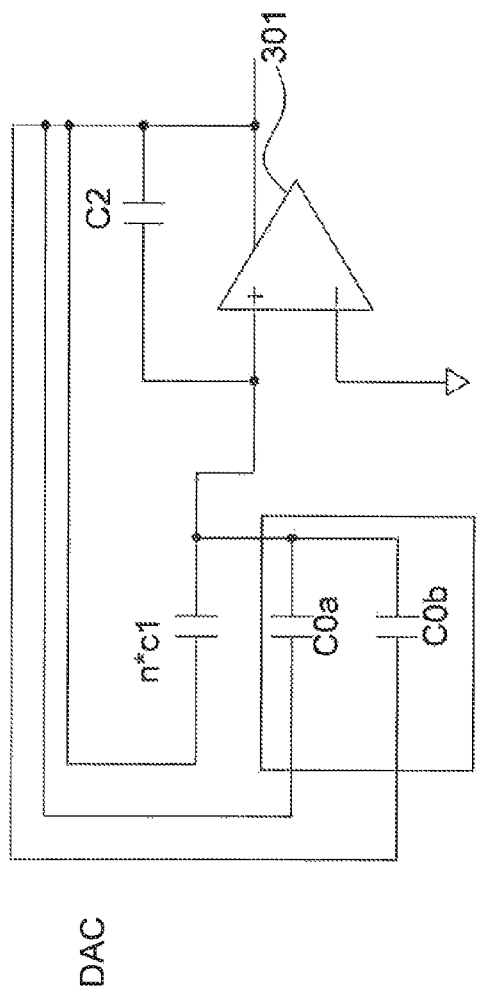
Fig. 3B
Fig. 3C

| input code | 000 | 001 | 010 | 011 | 100 | 101 | 110 | 111 |
|---|---|---|---|---|---|---|---|---|
| capacitor cell 7 | ☐ | ☐ | ☐ | ☐ | ☐ | ☐ | ☐ | ▨ |
| capacitor cell 6 | ☐ | ☐ | ☐ | ☐ | ☐ | ☐ | ▨ | ▨ |
| capacitor cell 5 | ☐ | ☐ | ☐ | ☐ | ☐ | ▨ | ▨ | ▨ |
| capacitor cell 4 | ☐ | ☐ | ☐ | ☐ | ▨ | ▨ | ▨ | ▨ |
| capacitor cell 3 | ☐ | ☐ | ☐ | ▨ | ▨ | ▨ | ▨ | ▨ |
| capacitor cell 2 | ☐ | ☐ | ▨ | ▨ | ▨ | ▨ | ▨ | ▨ |
| capacitor cell 1 | ☐ | ▨ | ▨ | ▨ | ▨ | ▨ | ▨ | ▨ |
| additional capacitor cell C0b | ☐ | ☐ | ☐ | ☐ | ☐ | ☐ | ☐ | ☐ |
| additional capacitor cell C0a | ▨ | ▨ | ▨ | ▨ | ▨ | ▨ | ▨ | ▨ |

Byb Dab Bya

Fig. 6A

| input code | 000 | 001 | 010 | 011 | 100 | 101 | 110 | 111 |
|---|---|---|---|---|---|---|---|---|
| capacitor cell 7 | ☐ | ☐ | ☐ | ☐ | ☐ | ☐ | ☐ | ▨ |
| capacitor cell 6 | ☐ | ☐ | ☐ | ☐ | ☐ | ☐ | ▨ | ▨ |
| capacitor cell 5 | ☐ | ☐ | ☐ | ☐ | ☐ | ▨ | ▨ | ▨ |
| capacitor cell 4 | ☐ | ☐ | ☐ | ☐ | ▨ | ▨ | ▨ | ▨ |
| capacitor cell 3 | ☐ | ☐ | ☐ | ▨ | ▨ | ▨ | ▨ | ▨ |
| capacitor cell 2 | ☐ | ☐ | ▨ | ▨ | ▨ | ▨ | ▨ | ▨ |
| capacitor cell 1 | ☐ | ▨ | ▨ | ▨ | ▨ | ▨ | ▨ | ▨ |
| additional capacitor cell C0b | ☐ | ☐ | ☐ | ☐ | ☐ | ☐ | ☐ | ☐ |
| additional capacitor cell C0a | ▨ | ▨ | ▨ | ▨ | ▨ | ▨ | ▨ | ▨ |

Fig. 6B

| input code | 000 | 001 | 010 | 011 | 100 | 101 | 110 | 111 |
|---|---|---|---|---|---|---|---|---|
| capacitor cell 7 | ☐ | ☐ | ☐ | ☐ | ☐ | ☐ | ☐ | ▨ |
| capacitor cell 6 | ☐ | ☐ | ☐ | ☐ | ☐ | ☐ | ▨ | ▨ |
| capacitor cell 5 | ☐ | ☐ | ☐ | ☐ | ☐ | ▨ | ▨ | ▨ |
| capacitor cell 4 | ☐ | ☐ | ☐ | ☐ | ▨ | ▨ | ▨ | ▨ |
| capacitor cell 3 | ☐ | ☐ | ☐ | ▨ | ▨ | ▨ | ▨ | ▨ |
| capacitor cell 2 | ☐ | ☐ | ▨ | ▨ | ▨ | ▨ | ▨ | ▨ |
| capacitor cell 1 | ☐ | ▨ | ▨ | ▨ | ▨ | ▨ | ▨ | ▨ |
| additional capacitor cell C0b | ☐ | ☐ | ☐ | ☐ | ☐ | ☐ | ☐ | ☐ |
| additional capacitor cell C0a | ▨ | ▨ | ▨ | ▨ | ▨ | ▨ | ▨ | ▨ |

Daa Bya   Byb

Fig. 6C

| input code | 000 | 001 | 010 | 011 | 100 | 101 | 110 | 111 |
|---|---|---|---|---|---|---|---|---|
| capacitor cell 7 | ☐ | ▨ | ▨ | ▨ | ▨ | ▨ | ▨ | ▨ |
| capacitor cell 6 | ☐ | ☐ | ▨ | ▨ | ▨ | ▨ | ▨ | ▨ |
| capacitor cell 5 | ☐ | ☐ | ☐ | ▨ | ▨ | ▨ | ▨ | ▨ |
| capacitor cell 4 | ☐ | ☐ | ☐ | ☐ | ▨ | ▨ | ▨ | ▨ |
| capacitor cell 3 | ☐ | ☐ | ☐ | ☐ | ▨ | ▨ | ▨ | ▨ |
| capacitor cell 2 | ☐ | ☐ | ☐ | ☐ | ☐ | ▨ | ▨ | ▨ |
| capacitor cell 1 | ☐ | ▨ | ▨ | ▨ | ▨ | ▨ | ▨ | ▨ |
| additional capacitor cell C0b | ☐ | ☐ | ☐ | ☐ | ☐ | ☐ | ☐ | ☐ |
| additional capacitor cell C0a | ▨ | ▨ | ▨ | ▨ | ▨ | ▨ | ▨ | ▨ |

Bya  Byb  Daa

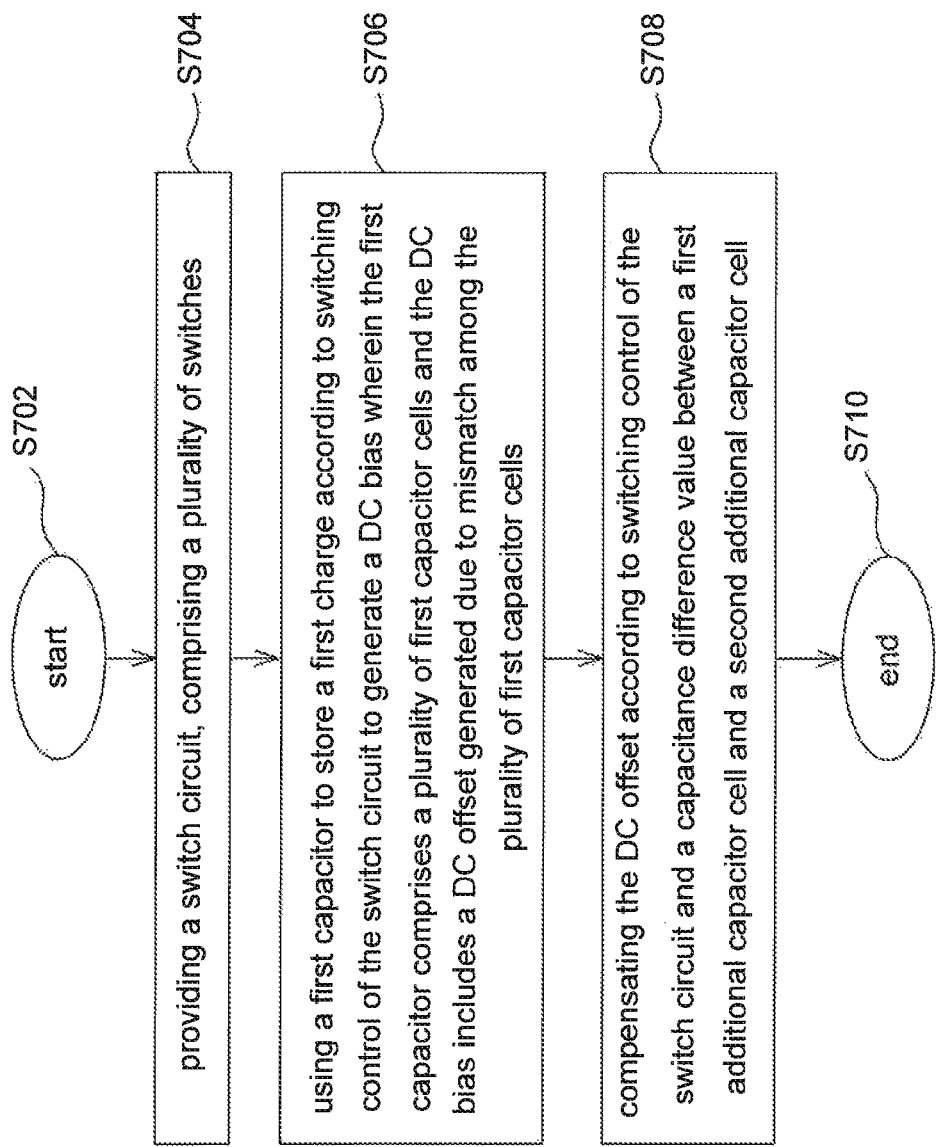

CONVERTER WITH AN ADDITIONAL DC OFFSET AND METHOD THEREOF

This application claims the benefit of the filing date of Taiwan Application Ser. No. TW103100251, filed on Jan. 3, 2014, the content of which is incorporated herein by reference.

BACKGROUND OF THE INVENTION

1. Field of the Invention

The invention relates to electronic devices, and more particularly, to a converter with an additional DC offset and method thereof.

2. Description of the Related Art

An offset of a normal electric signal often causes many problems. For example, in audio applications, a DC offset of output from an audio circuit causes pop-noise to human ears. Currently, the method to resolve such a pop-noise problem is to add a single inverted DC offset to reduce the DC offset but there are limitations on processing and environmental variations.

The above method can be applied to analog-to-digital converters (ADC) and digital-to-analog converters (DAC) but elimination of the DC offset or pop-noise is restricted. As shown in FIG. 1A, ADC 100a utilizes switch-cap. ADC 100a includes a loop filter 100a1, an N-bit quantizer 100a2 and an N-bit internal DAC 100a3. The above method can be applied to DAC 100b shown in FIG. 1B utilizing switch-cap. DAC 100b includes an operational amplifier 100b1, paired-up capacitors C1, C2 and paired-up switches S1, S2, S3, S4.

A 3-bit sigma-delta DAC is used as an example. Please refer to FIGS. 1B and 2A. As shown in FIG. 2A, the capacitor C1 of DAC 100b includes 7 capacitor cells (capacitor cells 1~7). A positive reference voltage VRP or a negative reference voltage VRN is supplied to the capacitor cells 1~7 according to 3-bit input codes having values, 000, 001, 010, 011, 100, 101, 110, and 111, so as to generate eight different corresponding states. When DAC 100b switches to switches S1, S2, S3, S4 according to clock signals CK1 and CK2, DAC 100b generates eight different charges according to eight values of the digital codes:

$(+1 +1 +1 +1 +1 +1 +1)*(C1/C2)=>+7*(C1/C2)$
$(+1 +1 +1 +1 +1 +1 -1)*(C1/C2)=>+5*(C1/C2)$
$(+1 +1 +1 +1 +1 -1 -1)*(C1/C2)=>+3*(C1/C2)$
$(+1 +1 +1 +1 -1 -1 -1)*(C1/C2)=>+1*(C1/C2)$
$(+1 +1 +1 -1 -1 -1 -1)*(C1/C2)=>-1*(C1/C2)$
$(+1 +1 -1 -1 -1 -1 -1)*(C1/C2)=>-3*(C1/C2)$
$(+1 -1 -1 -1 -1 -1 -1)*(C1/C2)=>-5*(C1/C2)$
$(-1 -1 -1 -1 -1 -1 -1)*(C1/C2)=>-7*(C1/C2)$

The charge $((+1 +1 +1 -1 -1 -1 -1)*(C1/C2)=>-1*(C1/C2))$ is used as an example. It is assumed that the positive reference voltage VRP is +1V and the negative reference voltage VRN is -1V. Then, according to the input code 100, the charge $-1*(C1/C2)$ is inputted to have capacitor cells 7, 6 and 5 receive the positive reference voltage VRP to obtain the value +1 (shown by blank rectangles) and to have capacitor cells 4, 3, 2 and 1 receive the negative reference voltage VRN obtain the value -1 (shown by rectangles with diagonal stripes). Therefore, the charge is $(+1+1+1-1-1-1-1)*(C1/C2)=-1*(C1/C2)$. If C1=C2, the charge is equal to -1. The charge obtained from the other input code can be derived by analogy. Thus, the operational amplifier 100b1 generates a DC bias or Von having the charges +7, +5, +3, +1, -1, -3, -5, -7.

However, generally capacitors of a DAC or ADC may have capacitor mismatch due to processing drift, environmental variations or asymmetrical factors so as to cause a DC offset of the DC bias Vop or Von. As shown in FIG. 2B, it is assumed that the capacitor cell 7 has capacitor mismatch with the other capacitor cells 1~6. As shown in the figure, the actual capacitance of the capacitor cell 7 is shown by the solid-line frame while the dashed-line frame of the capacitor cell 7 shows the capacitance matching with that of the other capacitor cells. According to the prior art, at the time, in order to compensate the capacitance deficiency of the capacitor cell 7 (area difference between the solid-line frame and the dashed-line frame), a tiny single inverted DC offset is generated to eliminate the DC offset caused by capacitor mismatch of the capacitor cell 7. However, due to processing drift, it is difficult to predict and produce the tiny capacitance (or variation of capacitor cells). Therefore, the DC offset problem of DAC and ADC still cannot be solved based on the previous mentioned technique.

SUMMARY OF THE INVENTION

In light of the above background, one objective of the present invention is to provide a converter which can be added with a plurality of inverted offsets having preset values.

In light of the above background, one objective of the present invention is to provide a converter which uses a difference among additional capacitor cells to generate inverted offsets having preset values so as to compensate the DC offset generated by the converter.

The converter of the present invention can be a trigonometric angle integral typed DAC or ADC.

According to one embodiment of the present invention, a converter is provided. The converter includes a switch circuit, a first capacitor, a plurality of additional capacitor cells and an operational amplifier. The switch circuit includes a plurality of switches. The first capacitor stores a first charge according to the switching control of the switch circuit. The plurality of additional capacitor cells includes a first additional capacitor cell and a second additional capacitor cell. There is a capacitance difference between the first additional capacitor cell and the second additional capacitor cell. The first additional capacitor cell and the second additional capacitor cell store a second charge and a third charge having different polarity and magnitude with the second charge according to the switching control of the switch circuit. The operational amplifier generates a DC bias according to the first charge wherein the DC bias includes a DC offset. The operational amplifier further generates an inverted DC offset according to a difference between the second charge and the third charge to compensate the DC offset.

According to another embodiment of the present invention, a converter is provided. The converter includes an operational amplifier, a first capacitor, a first additional capacitor cell and a second additional capacitor cell. The operational amplifier is used to generate a DC bias. The first capacitor includes a plurality of first capacitor cells to generate a first charge with a charge error value wherein at least one of the first capacitor cells has a capacitance error value related to the charge error value. The first additional capacitor cell stores a positive charge. The second additional capacitor cell stores a negative charge wherein there is a charge difference value between the positive charge and the negative charge. The operational amplifier generates the DC bias according to the first charge, the positive charge and the negative charge and the charge difference value is used to compensate the charge error value.

According to another embodiment of the present invention, a method for compensating an offset of a converter is provided. The method includes the following steps: providing a switch circuit, comprising a plurality of switches; using a first capacitor to store a first charge according to switching control of the switch circuit to generate a DC bias wherein the first capacitor comprises a plurality of first capacitor cells and the DC bias includes a DC offset generated due to mismatch among the plurality of first capacitor cells; and compensating the DC offset according to switching control of the switch circuit and a capacitance difference value between a first additional capacitor cell and a second additional capacitor cell.

The converter and method thereof according to embodiments of the present invention use differences among additional capacitor cells to produce a plurality of combinations of tiny inverted offsets to generate a DC offset to compensate the DC offset of the DC bias of the original circuit so as to solve the problem of capacitor mismatch of a converter of the prior art.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2A shows a schematic diagram illustrating a capacitor array of a digital-to-analog converter according to the prior art.

FIG. 2B shows another schematic diagram illustrating a capacitor array of a digital-to-analog converter according to the prior art.

FIG. 3B shows a schematic diagram illustrating the operating state of a converter as a digital-to-analog converter according to an embodiment of the invention.

FIG. 3C shows a schematic diagram illustrating the operating state of a converter as a digital-to-analog converter according to another embodiment of the invention.

FIG. 6A shows a schematic diagram illustrating first capacitor cells and additional capacitor cells according to an embodiment of the invention.

FIG. 6B shows a schematic diagram illustrating first capacitor cells and additional capacitor cells according to another embodiment of the invention.

FIG. 6C shows a schematic diagram illustrating first capacitor cells and additional capacitor cells according to another embodiment of the invention.

FIG. 6D shows a schematic diagram illustrating first capacitor cells and additional capacitor cells according to another embodiment of the invention.

FIG. 6E shows a schematic diagram illustrating first capacitor cells and additional capacitor cells according to another embodiment of the invention.

FIG. 7 shows a flow chart of a method providing an offset to a converter according to an embodiment of the invention.

DETAILED DESCRIPTION OF THE INVENTION

In this specification and the appended claims, some specific words are used to describe specific elements. It should be understood by those who are skilled in the art that some hardware manufacturer may use different names to indicate the same element. In this specification and the appended claims, elements are not differentiated by their names but their functions. As used herein and in the claims, the term "comprising" is inclusive or open-ended and does not exclude additional non-cited elements, compositional components, or method steps. Besides, the term "coupling", when used herein and in the claims, refers to any direct or indirect connection means. Thus, if the specification describes a first device is coupled to a second device, it indicates that the first device can be directly connected (via signal connection, including electrical connection, wireless transmission, optical transmission, etc.) to the second device, or be indirectly connected to the second device via another device or connection means.

As used herein and in the claims, the term "and/or" includes any and all combinations of one or more of the associated listed items. The use of the terms "a" and "an" and "the" and similar referents in the context of describing the invention are to be construed to cover both the singular and the plural, unless otherwise indicated herein or clearly contradicted by context.

Figure 1A:
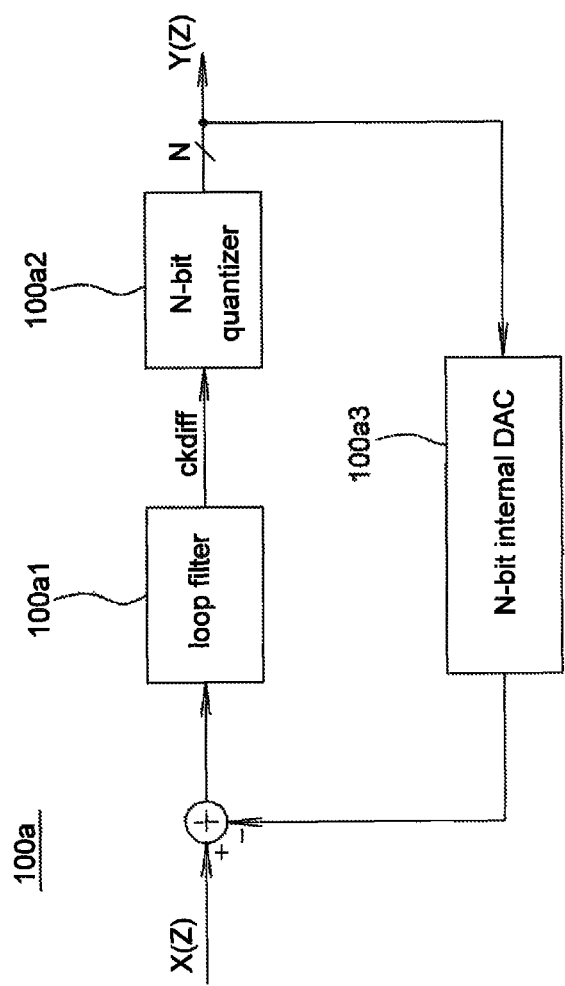
FIG. 1A shows a schematic diagram illustrating a switch-cap typed analog-to-digital converter according to the prior art.
Figure 1B:
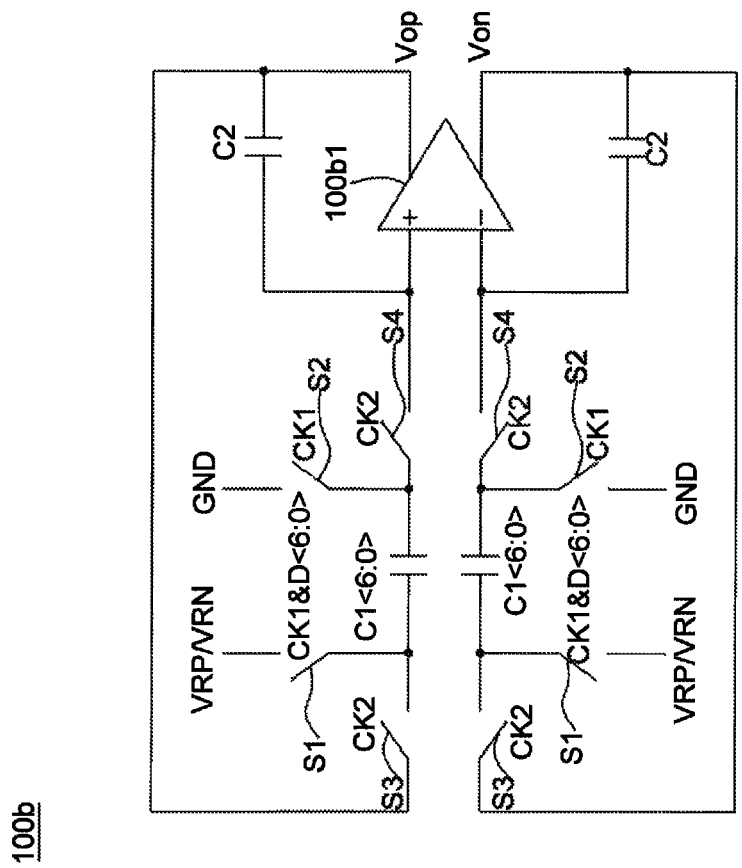
FIG. 1B shows a schematic diagram illustrating a switch-cap typed digital-to-analog converter according to the prior art.
Figure 3A:
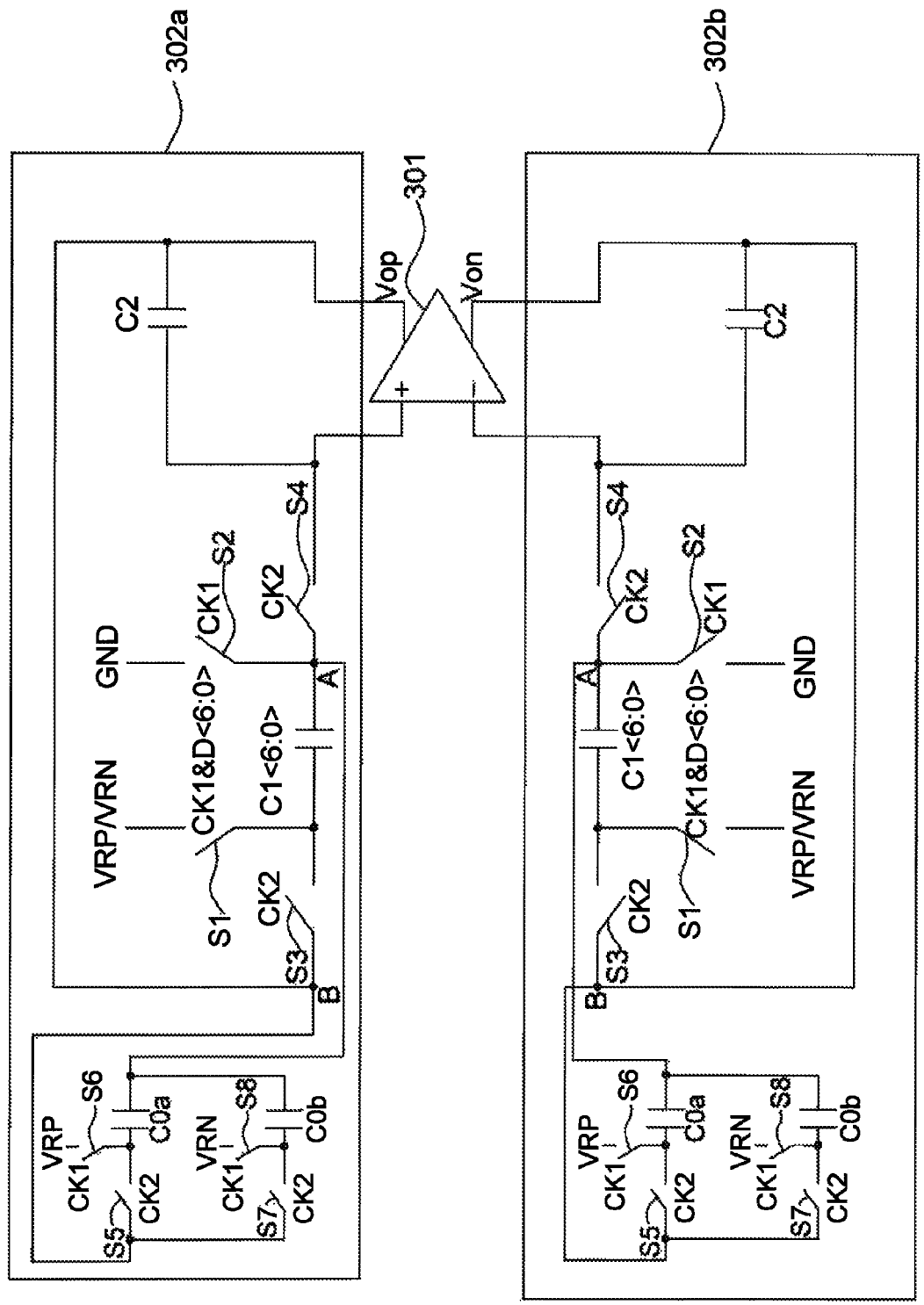
FIG. 3A shows a schematic diagram illustrating a converter added with an offset according to an embodiment of the invention.

FIG. 3A shows a schematic diagram illustrating a converter 300 added with an offset according to an embodiment of the invention. The converter 300 can be a digital-to-analog converter (DAC). The converter 300 includes an operational amplifier 301, a first switched capacitor circuit 302a and a second switched capacitor circuit 302b.

The first switched capacitor circuit 302a comprises a plurality of switches S1~S8 formed into a switch circuit, a first capacitor C1 as a sampling capacitor, a second capacitor C2 as a holding capacitor and a plurality of additional capacitor cells C0a, C0b, . . . . The second switched capacitor circuit 302b also comprises a plurality of switches S1~S8, a first capacitor C1, a second capacitor C2 and a plurality of additional capacitor cells C0a, C0b, . . . . The first additional capacitor cell C0a stores a positive charge and the second additional capacitor cell C0b stores a negative charge.

The operational amplifier 301 is used to generate outputs at least including a DC bias Vop or Von. Since the first capacitor C1 may have a capacitance error value due to processing drift, environmental variations or asymmetrical factors so as to cause the DC bias Vop or Von generated according to the first capacitor C1 and the second capacitor C2 to have a DC offset. As shown in the figure, the first switched capacitor circuit 302a and the second switched capacitor circuit 302b are coupled to a non-inverting input node and an inverting input node of the operational amplifier 301, respectively. The non-inverting input node and the inverting input node of the operational amplifier 301 receive two charges from the first switched capacitor circuit 302a and the second switched capacitor circuit 302b, respectively, to generate the DC bias Vop or Von.

Since the configuration and operating principle of the first switched capacitor circuit 302a and the second switched capacitor circuit 302b are the same, in the following description only the single end of the first switched capacitor circuit 302a is illustrated.

In the switches S1~S8, the switches S1, S2, S6 and S8 are turned on or off according to control of the first clock signal CK1; the switches S3, S4, S5 and 37 are turned on or off according to control of the second clock signal CK2. A first end of the switch S1 is coupled to the positive reference voltage VRP or negative reference voltage VRN and a second end of the switch S1 is coupled to a first end of the switch S3 and a first end of the first capacitor C1. A first end of the switch S2 is coupled to a certain voltage level (such as ground GND) and a second end of the switch S2 is coupled to a second end of the first capacitor C1 and a first end of the switch S4 to form a first node A. A second end of the switch S3 is coupled to a first end of the switch S5 and a first end of the switch S7 to form a second node B. A second end of the switch S4 is coupled to a first end of the first capacitor C1 and the non-inverting input node of the operational amplifier 301. A first end of the first additional capacitor cell C0a is coupled to the first node A and a first end of the second additional capacitor cell C0b. A second end of the first additional capacitor cell C0a is coupled to a first end of the switch S6 and a second end of the switch S5. A second end of the switch S6 is coupled to the positive reference voltage VRP. A second end of the switch S7 is coupled to a second end of the second additional capacitor cell C0b and a first end of the switch S8. A second end of the switch S8 is coupled to the negative reference voltage VRN.

The first capacitor C1 comprises a plurality of first capacitor cells. In one embodiment shown in FIG. 6A, the first capacitor C1 comprises capacitor cells 1~7. Certainly, it is only one example and the invention is not limited to this example and can have other types of capacitors or a different number of capacitors. In the capacitor C1, at least one of the first capacitor cells has a capacitance error value possibly due to environmental factors such as processing drift. For example, the capacitor cell 7 shown in FIG. 6A has a capacitance error value. It should be noted that the capacitance error value of the capacitor cell 7 shown in FIGS. 6A~6E is only an example and the magnitude of the error is not limited to this example. Besides, it is not limited to the case that only the capacitor cell 7 has a capacitance error value, meaning that the other capacitor cells may have a capacitance error value. During operation, the first capacitor C1 and the second capacitor C2 generate a first charge having a capacitance error value according to the positive reference voltage VRP or the negative reference voltage VRN.

For the additional capacitor cells C0, each additional capacitor cell C0 has different magnitude and the capacitance difference between additional capacitor cells C0 has a preset ratio. For example, as shown in FIG. 3A, the first additional capacitor cell C0a stores a positive charge and receives the positive reference voltage VRP to store a positive charge. The second additional capacitor cell C0b stores a negative charge and receives the negative reference voltage VRN to store a negative charge. There is a capacitance difference value delta between the first additional capacitor cell C0a and the second additional capacitor cell C0b. The capacitance difference value delta is used as a compensating capacitor offset. It is assumed that the positive reference voltage VRP and the negative reference voltage VRN is +1V and −1V, respectively. When the first additional capacitor cell C0a receives the positive reference voltage VRP to generate a positive charge (second charge) and the second additional capacitor cell C0b receives the negative reference voltage VRN to generate a negative charge (third charge), a charge difference value is generated between the positive charge and the negative charge since the additional capacitor cells C0a and C0b have a capacitance difference value delta. The operational amplifier 301 generates an inverted offset according to the charge difference value to compensate the DC offset of the operational amplifier 301 due to the capacitance error value of the first capacitor C1.

In one embodiment, referring to FIGS. 3A, 3B and 3C, FIGS. 3B and 3C show the operating state diagrams of the converter 300. The operating state of the converter 300 in this embodiment is illustrated by a single end operating method. One having ordinary skill in the art should understand the differential operating method of the converter from the following description and thus its details will be omitted. During operation, the switches S1, S2, S6 and S8 in FIG. 3A are turned on according to the first clock signal CK1 while the switches S3, S4, S5 and S7 are turned off according to the second clock signal CK2. At the time, the first switched capacitor circuit 302a is divided into two parts, left and right, as shown in FIG. 3B. The positive reference voltage VRP or the negative reference voltage URN charges the first capacitor C1 while the positive reference voltage VRP charges the first additional capacitor cell C0a and the negative reference voltage VRN charges the second additional capacitor cell C0b. Then, as shown in FIG. 3C, when the switches S1, S2, S6 and S8 of the switched capacitor circuit 302a are turned off according to the first clock signal CK1 and the switches S3, S4, S5 and S7 are turned on according to the second clock signal CK2, the first capacitor C1, the first additional capacitor cell C0a and the second additional capacitor cell C0b make the charges of the first capacitor C1, the first additional capacitor cell C0a and the second additional capacitor cell C0b be supplied to output nodes for the operational amplifier 301 to output a DC bias.

Figure 4A:
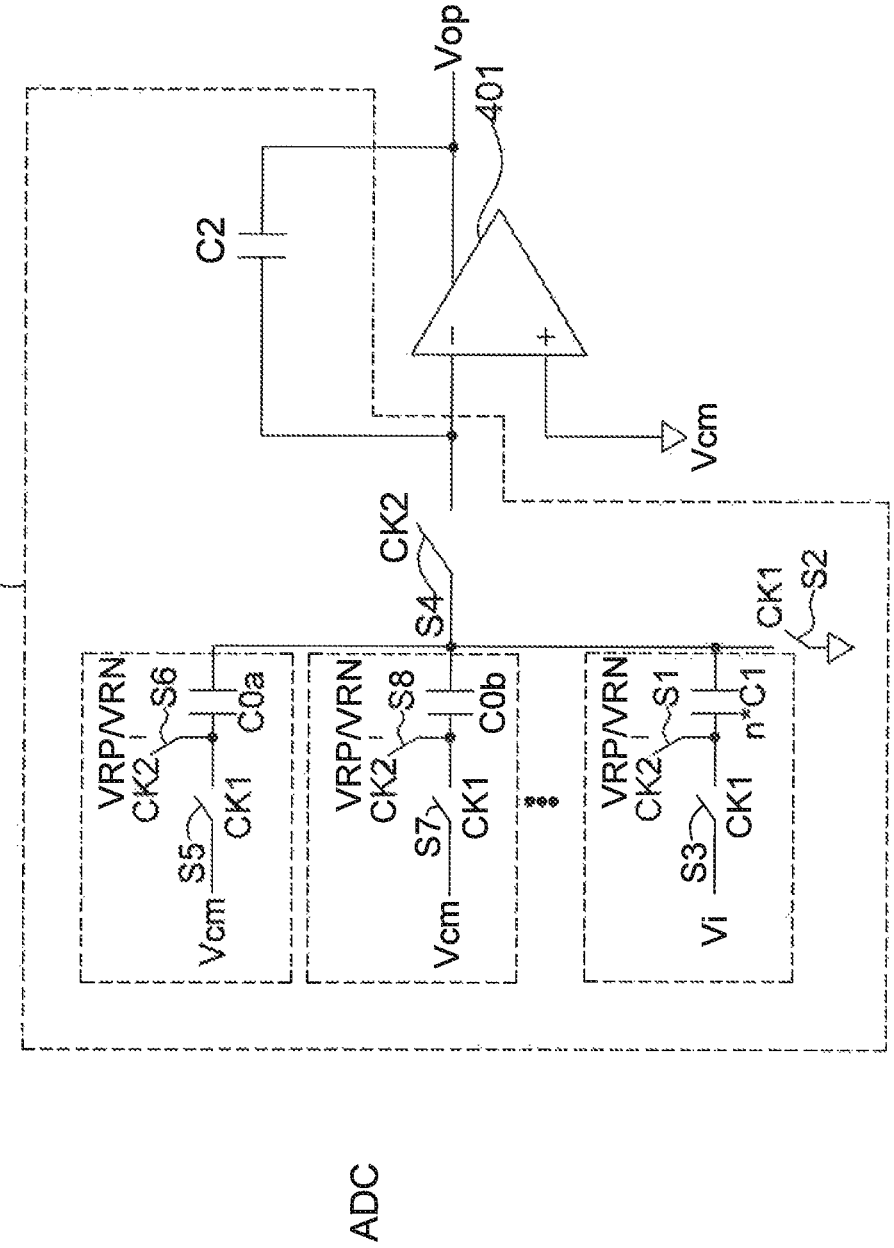
FIG. 4A shows a schematic diagram illustrating the operating state of a converter as an analog-to-digital converter according to an embodiment of the invention.

FIG. 4A shows a schematic diagram illustrating a converter 400 according to another embodiment of the invention. The converter 400 is an analog-to-digital converter (ADC). The converter 400 in this embodiment is illustrated by a single end converter. One having ordinary skill in the art should understand the differential end converter from the following description and thus its details will be omitted.

The converter 400 comprises an operational amplifier 401 and a switched capacitor circuit 402. The switched capacitor circuit 402 comprises a plurality of switches S1~S8, a first capacitor C1, a second capacitor C2 and a plurality of additional capacitor cells C0a, C0b, . . . . The first additional capacitor cell C0a stores a positive charge and the second additional capacitor cell C0b stores a negative charge. The coupling between the above elements is shown in the figure and is not further described.

Figure 4B:
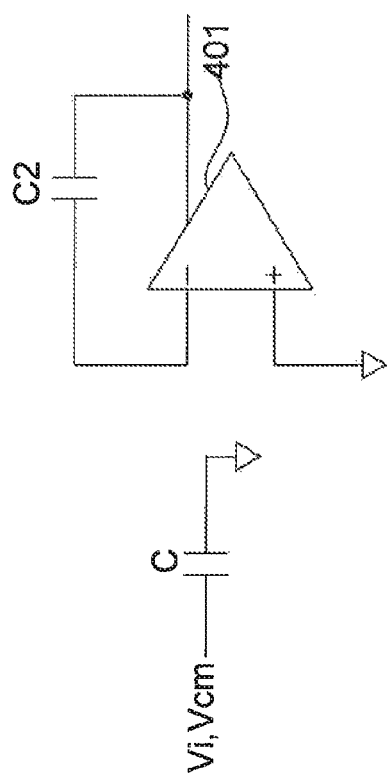
FIG. 4B shows a schematic diagram illustrating the equivalent circuit of the converter shown in FIG. 4A according to an embodiment of the invention.
Figure 4C:
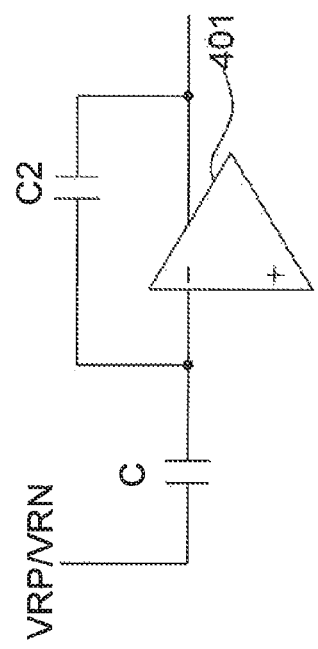
FIG. 4C shows a schematic diagram illustrating the equivalent circuit of the converter shown in FIG. 4A according to an embodiment of the invention.

FIGS. 4B and 4C show the operating state diagrams of ADC 400. In FIG. 4B, when the switched capacitor circuit 402 of ADC 400 is in switching operation, the switches S2, S3, S5 and S7 of the switched capacitor circuit 402 are turned on according to the first clock signal CK1 while the switches S1, S4, S6 and S8 are turned off according to the second clock signal CK2. At the time, the switched capacitor circuit 400 is divided into two parts, left and right. For clarity, the first capacitor C1, the first additional capacitor cell C0a and the second additional capacitor cell C0b are labeled by C. On the left-hand side of the figure, the circuit of the first capacitor C1 receives the input voltage Vi for charging and the circuits of the first additional capacitor cell C0a and the second additional capacitor cell C0b receive the voltage Vcm for charging. The voltage Vcm is a charge transfer reference voltage or common mode voltage. As shown in FIG. 4C, when the switched capacitor circuit 402 of ADC 400 is in switching operation, the switches S2, S3, S5 and S7 of the switched capacitor circuit 402 are turned off according to the first clock signal CK1 while the switches S1, S4, S6 and S8 are turned on according to the second clock signal CK2. The first capacitor C1, the first additional capacitor cell C0a and the second additional capacitor cell C0b receive the positive reference voltage VRP or the negative reference voltage VRN to store a first charge, a second charge and a third charge, respectively. If the first additional capacitor cell C0a receives the positive reference voltage VRP, the second charge is positive, the second additional capacitor cell C0b receives the negative reference voltage VRN and the third charge is negative and vice versa.

Figure 5A:
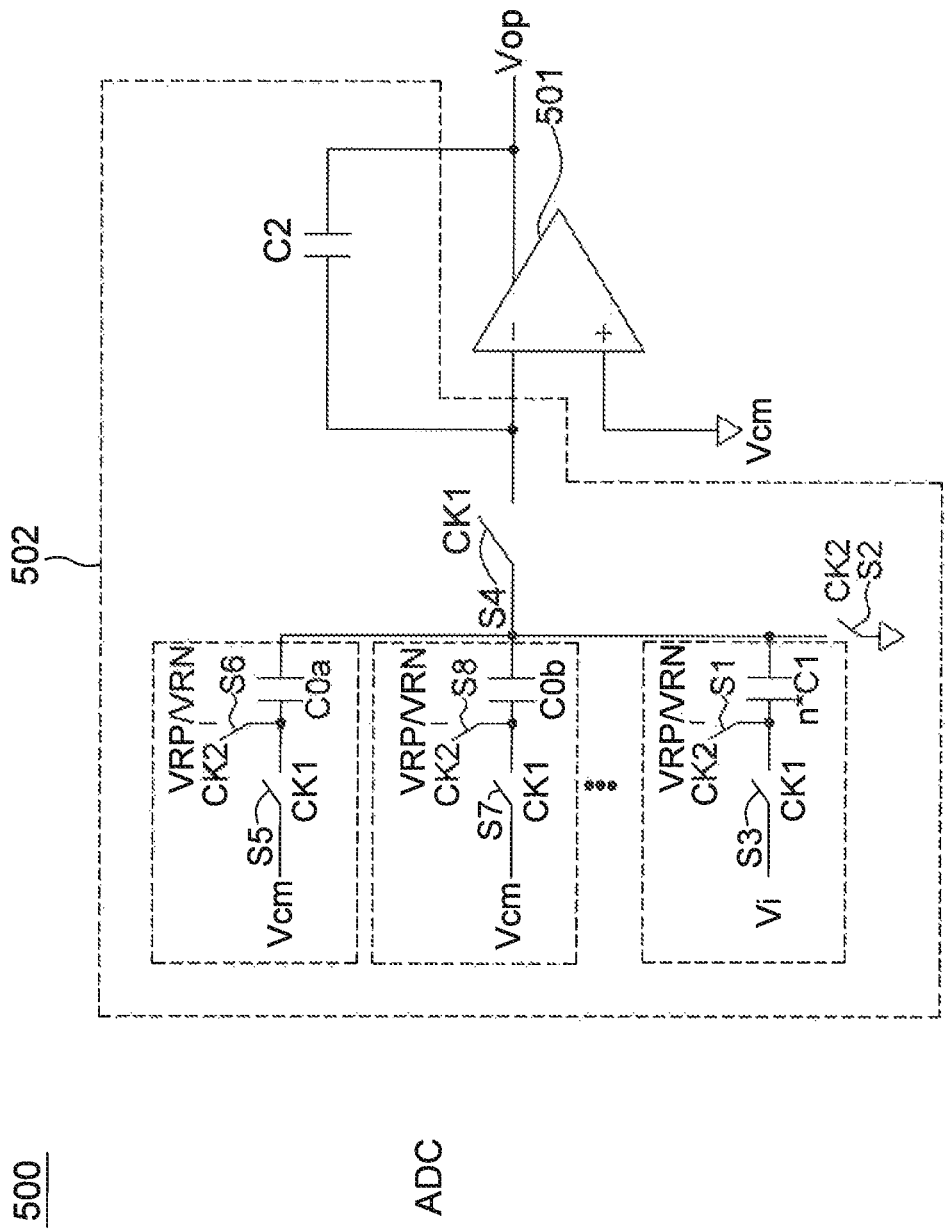
FIG. 5A shows a schematic diagram illustrating the operating state of a converter as an analog-to-digital converter according to an embodiment of the invention.

FIG. 5A shows a schematic diagram illustrating a converter 500 according to another embodiment of the invention. The converter 500 is an analog-to-digital converter (ADC). The converter 500 in this embodiment is illustrated by a single end converter. One having ordinary skill in the art should understand the differential end converter from the following description and thus its details will be omitted.

The converter 500 comprises an operational amplifier 501 and a switched capacitor circuit 502. The switched capacitor circuit 502 comprises a plurality of switches S1~S8, a first capacitor C1, a second capacitor C2 and a plurality of additional capacitor cells C08, C0b, . . . . The first additional capacitor cell C0a stores a positive charge or a negative charge and the second additional capacitor cell C0b stores a positive charge or a negative charge. The coupling between the above elements is shown in the figure and is not further described.

Figure 5B:
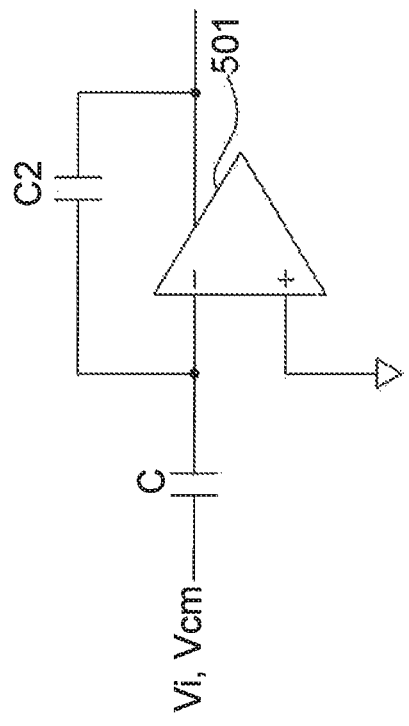
FIG. 5B shows a schematic diagram illustrating the equivalent circuit of the converter shown in FIG. 5A according to an embodiment of the invention.
Figure 5C:
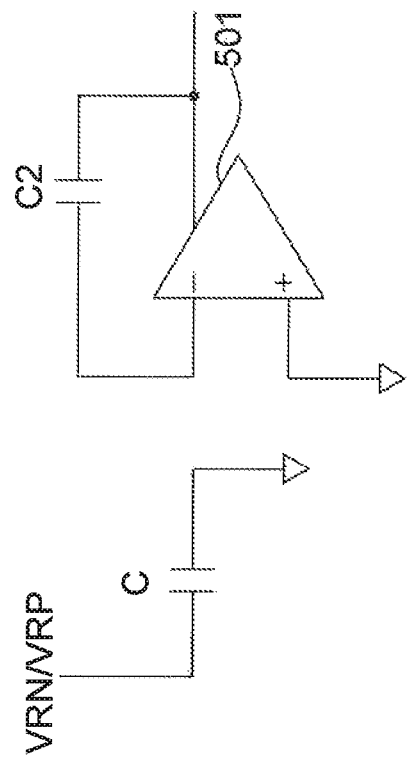
FIG. 5C shows a schematic diagram illustrating the equivalent circuit of the converter shown in FIG. 5A according to an embodiment of the invention.

FIGS. 5B and 5C show the operating state diagrams of ADC 500. The switching operation of the switched capacitor circuit 502 of ADC 500 shown in FIGS. 5B and 5C is basically similar to that of ADC 400 shown in FIGS. 4B and 4C. The difference is that the switch S2 is controlled by the second clock signal CK2 and the switch S4 is controlled by the first clock signal CK1. FIGS. 5B and 5C are reversed with respect to FIGS. 4B and 4C. The details of the operational method and technical characteristics can be derived from the above description and will not be given hereinafter.

The following describes that the first capacitor C1, the first additional capacitor cell C0a, the second additional capacitor cell C0b receive the positive reference voltage VRP or the negative reference voltage VRN to store a first charge, a second charge and a third charge, respectively. The capacitance difference value by subtracting the second charge from the third charge is used to compensate the charge error value of the first charge so as to achieve the operation method of generating an inverted bias to compensate the DC offset of the DC bias. The first capacitor C1 in this embodiment is an example of a 3-bit <6:0> capacitor array shown in FIG. 6A. Certainly, the present invention is not limited to this example and can have capacitors with other types or bits.

In this embodiment, a part of the additional capacitor cells C0a, C0b, . . . are coupled to the positive reference voltage VRP and the other part of the additional capacitor cells are coupled to the negative reference voltage VRN. As shown in FIG. 6A, the capacitance ratio of the first additional capacitor cell C0a to any capacitor cell 1~7 of the first capacitor is 100% while the capacitance ratio of the second additional capacitor cell C0b to any capacitor cell 1~7 of the first capacitor is 99%. The difference between two capacitor cells C0a and C0b can be used to obtain a tiny or extremely small capacitance difference value delta (or delta*C1), such as 1%*C1. When the switched capacitor circuit is in switching operation, the sum of the first capacitance X of the first additional capacitor cell C0a and the second capacitance Y of the second additional capacitor cell C0b multiplied by the positive reference voltage VRP (assumed to be +1V) and the negative reference voltage VRN (assumed to be −1V), respectively, is executed to obtain a voltage difference value X−Y. The voltage difference value X−Y is the inverted offset, X−Y=X*VRP+Y*VRN where |X−Y|=voltage difference value<1, VRP=+1, VRN=−1. It should be noted that the above values are exampled and the present invention is not limited to these values. Then, during operation, in the converter 300 shown in FIG. 6A, according to the selection of input codes, the first capacitor C1 and the second capacitor C2 have seven of the first capacitor cells be separately multiplied by the positive reference voltage VRP or the negative reference voltage VRN, then combined with the second capacitor C2, and summed up with the first and the second additional capacitor cells C0a and C0b separately multiplied by the positive reference voltage VRP and the negative reference voltage VRN so as to obtain a total charge including an inverted offset shown as follows:

(+1 +1 +1 +1 +1 +1 +1)*(C1/C2)+(+1 −1+delta)*(C1/C2)=>(+7 +delta)*(C1/C2);
(+1 +1 +1 +1 +1 +1 −1)*(C1/C2)+(+1 −1+delta)*(C1/C2)=>(+5+delta)*(C1/C2);
(+1 +1 +1 +1 +1 −1 −1)*(C1/C2)+(+1 −1+delta)*(C1/C2)=>(+3+delta)*(C1/C2);
(+1 +1 +1 +1 −1 −1 −1)*(C1/C2)+(+1 −1+delta)*(C1/C2)=>(+1+delta)*(C1/C2);
(+1 +1 +1 −1 −1 −1 −1)*(C1/C2)+(+1 −1+delta)*(C1/C2)=>(−1+delta)*(C1/C2);
(+1 +1 −1 −1 −1 −1 −1)*(C1/C2)+(+1 −1+delta)*(C1/C2)=>(−3+delta)*(C1/C2);
(+1 −1 −1 −1 −1 −1 −1)*(C1/C2)+(+1 −1+delta)*(C1/C2)=>(−5+delta)*(C1/C2);
(−1 −1 −1 −1 −1 −1 −1)*(C1/C2)+(+1 −1+delta)*(C1/C2)=>(−7+delta)*(C1/C2).

By this way, the total capacitance value can be (+7+delta), (+5+delta), (+3+delta), (+1+delta), (−1+delta), (−3+delta), (−5+delta), and (−7+delta) where delta is determined by the first and the second additional capacitor cells C0a and C0b. For example, when the magnitude ratio of the first additional capacitor cells C0a to the first capacitor C1 is 100% and the magnitude ratio of the second additional capacitor cell C0b to the first capacitor C1 is 99%, (+1 +1 +1 +1 +1 +1 +1)*(C1/C2)+(+1 −1+delta)*(C1/C2)=>(+7+delta)*(C1/C2) is used as one example for illustration. At first, the first additional capacitor cells C0a is +1 to obtain the magnitude ratio of the first additional capacitor cells C0a to the first capacitor C1 to be 100% while the second additional capacitor cell C0b is −1+delta to obtain the magnitude ratio of the second additional capacitor cell C0b to the first capacitor C1 to be 99%. In FIG. 6A, the blank dashed-line frame Dab of the second additional capacitor cell C0b represents −1 and the shrunk solid-line frame Byb represents −1+delta since the difference between the shrunk solid-line frame Byb and the blank dashed-line frame Dab is the preset capacitance difference value delta. The first capacitor C0a is +1 and the rectangle Bya with diagonal stripes of the first capacitor C0a in FIG. 6A is +1. Then, if the input code is 111, the first capacitor cells 1~7 are multiplied by the positive reference voltage VRP to have all the charges of the first capacitor cells 1~7 be +1.

Thus, when the switched capacitor circuit is in operation, the total charge (+7+delta)*(C1/C2) is generated. The total charge (+7+delta)*(C1/C2) is used to obtain a DC bias Vop or Von including an inverted offset. The inverted offset is used to compensate the error caused by the DC offset so as to solve the problem in the prior art.

The following describes determination of the various ratios of the capacitance difference value delta by the first additional capacitor cells C0a and the second additional capacitor cell C0b.

In one embodiment, as shown in FIG. 6B, when all capacitor cells of the first capacitor C1 has no mismatch, compensating an offset is not required and the capacitances of the first additional capacitor cells C0a and the second additional capacitor cell C0b can be set to the same. That is, the capacitance of the first additional capacitor cells C0a is equal to the capacitance of any capacitor cell of the first capacitor C1 and the capacitance of the second additional capacitor cell C0b is also equal to the capacitance of any capacitor cell of the first capacitor C1. At the time, the sum of the first capacitance X of the first additional capacitor cell C0a and the second capacitance Y of the second additional capacitor cell C0b multiplied by the positive reference voltage VRP (assumed to be +1V) and the negative reference voltage VRN (assumed to be −1V), respectively, is executed to obtain a voltage difference value X−Y=0. Thus, the inverted offset is equal to zero.

In one embodiment, as shown in FIG. 6O, the value of the first additional capacitor cell C0a is equal to the value of any capacitor cell of the first capacitor C1+the capacitance difference value delta, shown by the dashed-line frame Daa+delta equal to the solid-line frame Bya. The value of the second additional capacitor cell C0b is equal to the value of any capacitor cell of the first capacitor C1, shown by the solid-line frame Byb. When the switched capacitor circuit is in switching operation, the first capacitance X of the first additional capacitor cell C0a is multiplied by the positive reference voltage VRP (assumed to be +1V) to obtain +1+delta and then the second capacitance Y of the second additional capacitor cell C0b is multiplied by the negative reference voltage VRN (assumed to be −1V) to obtain −1 and finally a voltage difference X−Y is obtained, that is, inverted offset (+1+delta)−1=delta. After the converter is added with the inverted offset, according to the input code, the operational amplifier generates a plurality of total charges including an inverted offset, shown as follows:
(+1 +1 +1 +1 +1 +1 +1)*(C1/C2)+(+1+delta −1)*(C1/C2)=> (+7+delta)*(C1/C2);
(+1 +1 +1 +1 +1 +1 −1)*(C1/C2)+(+1+delta −1)*(C1/C2)=> (+5+delta)*(C1/C2);
(+1 +1 +1 +1 +1 −1 −1)*(C1/C2)+(+1+delta −1)*(C1/C2)=> (+3+delta)*(C1/C2);
(+1 +1 +1 +1 −1 −1 −1)*(C1/C2)+(+1+delta −1)*(C1/C2)=> (+1+delta)*(C1/C2);
(+1 +1 +1 −1 −1 −1 −1)*(C1/C2)+(+1+delta −1)*(C1/C2)=> (−1+delta)*(C1/C2);
(+1 +1 −1 −1 −1 −1 −1)*(C1/C2)+(+1+delta −1)*(C1/C2)=> (−3+delta)*(C1/C2);
(+1 −1 −1 −1 −1 −1 −1)*(C1/C2)+(+1+delta −1)*(C1/C2)=> (−5+delta)*(C1/C2);
(−1 −1 −1 −1 −1 −1 −1)*(C1/C2)+(+1+delta −1)*(C1/C2)=> (−7+delta)*(C1/C2).

Figure 6E:
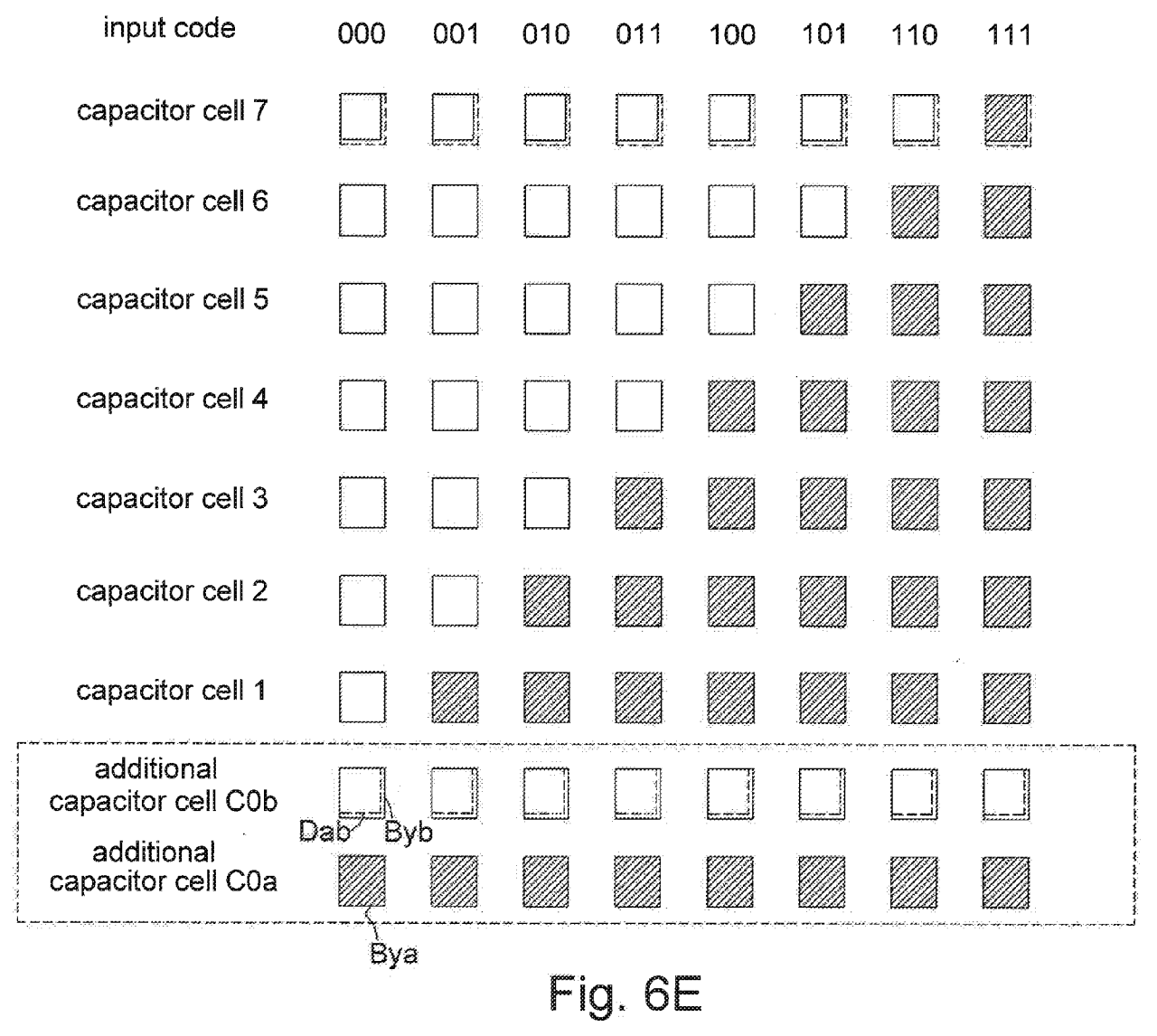

Further the value of the additional capacitor cell C0a and C0b are not limited by above mentioned embodiment. In an embodiment, as shown in FIG. 6D, the value of the first additional capacitor cell C0a may be equal to the value of any capacitor cell of the first capacitor C1−the capacitance difference value delta, and the value of the second additional capacitor cell C0b is equal to the value of any capacitor cell of the first capacitor C1. In another embodiment, as shown in FIG. 6E, the value of the first additional capacitor cell C0a is equal to the value of any capacitor cell of the first capacitor C1, and the second additional capacitor cell C0b may be equal to the value of any capacitor cell of the first capacitor C1−the capacitance difference value delta. According to the above mentioned contents, operation methods of embodiments in FIGS. 6D and 6E will be understood by those of ordinary skill in the art and that will not be described herein.

In another embodiment, the number of additional capacitor cells is not limited to two and can be any number, such as 6. The capacitance offset can be
[(+1)+(−1+delta1)+(1+delta2)+(−1+delta3)+(1+delta4)+ (−1+delta5)]*C1=(delta1+delta2+delta3+delta4+ delta5)*C1.
Furthermore, the capacitance offset or inverted offset can be generated by various combinations of capacitance difference values (delta 1~delta 5) between additional capacitor cells. In one embodiment, the method of compensating a DC offset can be conducted by compensating the DC offset according to switching control of the switch circuit, a plurality of ratios of the additional capacitor cell to any capacitor cell of the first capacitor C1 or a capacitance difference value between additional capacitor cells. The ratios can be for example a first ratio of a first additional capacitor cell C0a to any capacitor cell of the first capacitor C1, a second ratio of a second additional capacitor cell C0b to any capacitor cell of the first capacitor C1, a third ratio of a third additional capacitor cell C0c (not shown) to any capacitor cell of the first capacitor C1. It should be noted that the number of capacitor cells can be adjusted.

It should be noted that the above positive reference voltage VRP and the above negative reference voltage VRN can be any other values, but not limited to +1 and −1. The ratios of the additional capacitor cells can be adjusted whenever needed, such as 102% and 98% of the magnitude of any capacitor cell of the first capacitor C1 but not limited to ratio setting with respect to the first capacitor C1.

FIG. 7 shows a flow chart of a method providing an offset to a converter according to an embodiment of the invention. The method includes the following steps:

Step S702: start;

Step S704: providing a switch circuit, comprising a plurality of switches;

Step S706: using a first capacitor to store a first charge according to switching control of the switch circuit to generate a DC bias wherein the first capacitor comprises a plurality of first capacitor cells and the DC bias includes a DC offset generated due to mismatch among the plurality of first capacitor cells;

Step S708: compensating the DC offset according to switching control of the switch circuit and a capacitance difference value between a first additional capacitor cell and a second additional capacitor cell;

Step S710: end.

In conclusion, the converter according to embodiments of the present invention uses differences among additional capacitor cells to produce a plurality of combinations of tiny inverted offsets to generate a DC offset to compensate the DC offset of the DC bias of the original circuit so as to solve the problem of capacitor mismatch of a converter of the prior art While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A converter, comprising:
   a switch circuit, comprising a plurality of switches;
   a first capacitor, storing a first charge according to switching control of the switch circuit and comprising a first additional capacitor cell and a second additional capacitor cell wherein there is a capacitor difference between the first additional capacitor cell and the second additional capacitor cell; and the first additional capacitor cell and the second additional capacitor cell store a second charge and a third charge having different polarity and magnitude with the second charge, respectively, according to switching control of the switch circuit; and
   an operational amplifier, generating a DC bias including a DC offset according to the first charge and further generating an inverted DC offset according to a difference between the second charge and the third charge to compensate the DC offset.

2. The converter according to claim 1, wherein the first capacitor comprises a plurality of first capacitor cells, the first additional capacitor cell has a capacitance less than that of the first capacitor cell, and the second additional capacitor cell has a capacitance not less than that of the first capacitor cell.

3. The converter according to claim 1, wherein the first capacitor comprises a plurality of first capacitor cells and the DC offset is generated due to mismatch among the plurality of first capacitor cells.

4. The converter according to claim 1, wherein a first ratio is defined as a value of a capacitance of a first additional capacitor cell to that of a first capacitor cell, a second ratio is defined as a value of a capacitance of a second additional capacitor cell to that of a first capacitor cell, and the operational amplifier compensates the DC offset according to a difference of the first ratio and the second ratio.

5. A converter, comprising:
   an operational amplifier, generating a DC bias;
   a first capacitor, comprising a plurality of first capacitor cells to generate a first charge with a charge error value wherein at least one of the first capacitor cells has a capacitance error value related to the charge error value;
   a first additional capacitor cell, storing a positive charge; and
   a second additional capacitor cell, storing a negative charge wherein there is a charge difference value between the positive charge and the negative charge;
   wherein the operational amplifier generates the DC bias according to the first charge, the positive charge and the negative charge and the charge difference value is used to compensate the charge error value.

6. The converter according to claim 5, further comprising:
   a plurality of switches, switching among the first capacitor, the first additional capacitor cell and the second additional capacitor cell for charging and discharging according to a first clock signal and a second clock signal.

7. The converter according to claim 5, wherein there is a capacitance difference value between the first additional capacitor cell and the second additional capacitor cell and the operational amplifier compensates the charge error value according to the capacitance difference value.

8. The converter according to claim 5, wherein a first ratio is defined as a value of a capacitance of a first additional capacitor cell to that of a first capacitor cell, a second ratio is defined as a value of a capacitance of a second additional capacitor cell to that of a first capacitor cell, and the operational amplifier compensates the DC offset according to the first ratio and the second ratio.

9. A method for compensating an offset of a converter, comprising:
   providing a switch circuit, comprising a plurality of switches;
   using a first capacitor to store a first charge according to switching control of the switch circuit to generate a DC bias wherein the first capacitor comprises a plurality of first capacitor cells and the DC bias includes a DC offset generated due to mismatch among the plurality of first capacitor cells; and
   compensating the DC offset according to switching control of the switch circuit and a capacitance difference value between a first additional capacitor cell and a second additional capacitor cell.

10. The method according to claim 9, wherein the first additional capacitor cell has a capacitance more than that of the first capacitor cell and the second additional capacitor cell has a capacitance not more than that of the first capacitor cell.

11. The method according to claim 9, wherein a first ratio is defined as a value of a capacitance of a first additional capacitor cell to that of a first capacitor cell, a second ratio is defined as a value of a capacitance of a second additional capacitor cell to that of a first capacitor cell, and the step of compensating the DC offset comprises: compensating the DC offset according to the first ratio and the second ratio.

12. The method according to claim 9, wherein the step of compensating the DC offset further comprises:
   compensating the DC offset according to switching control of the switch circuit and a third ratio of a capacitance of a third additional capacitor cell to that of a first capacitor cell.

* * * * *